United States Patent
Yao et al.

(10) Patent No.: US 9,923,669 B2
(45) Date of Patent: Mar. 20, 2018

(54) DISTRIBUTED REED-SOLOMON CODES FOR SIMPLE MULTIPLE ACCESS NETWORKS

(71) Applicant: CALIFORNIA INSTITUTE OF TECHNOLOGY, Pasadena, CA (US)

(72) Inventors: Hongyi Yao, Pasadena, CA (US); Tracey C. Ho, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 52 days.

(21) Appl. No.: 14/836,755

(22) Filed: Aug. 26, 2015

(65) Prior Publication Data

US 2016/0036563 A1  Feb. 4, 2016

Related U.S. Application Data

(63) Continuation of application No. 13/853,857, filed on Mar. 29, 2013, now Pat. No. 9,148,173.

(60) Provisional application No. 61/618,284, filed on Mar. 30, 2012.

(51) Int. Cl.
| | |
|---|---|
| *H03M 13/00* | (2006.01) |
| *H04L 1/00* | (2006.01) |
| *H03M 13/05* | (2006.01) |
| *H03M 13/15* | (2006.01) |
| *H03M 13/27* | (2006.01) |
| *G06F 11/10* | (2006.01) |

(52) U.S. Cl.
CPC ............ *H04L 1/0076* (2013.01); *G06F 11/10* (2013.01); *H03M 13/05* (2013.01); *H03M 13/151* (2013.01); *H03M 13/1515* (2013.01); *H03M 13/27* (2013.01); *H04L 1/0041* (2013.01); *H04L 1/0057* (2013.01)

(58) Field of Classification Search
CPC ...... H04L 1/0076; H04L 1/0041; G06F 11/10; H03M 13/05; H03M 13/151; H03M 13/1515; H03M 13/27
See application file for complete search history.

(56) References Cited

U.S. PATENT DOCUMENTS

| | | |
|---|---|---|
| 5,452,328 A | 9/1995 | Rice |
| 6,182,214 B1 | 1/2001 | Hardjono |
| 7,123,719 B2 | 10/2006 | Sowa et al. |
| 7,203,871 B2 | 4/2007 | Turner et al. |
| 7,581,156 B2 | 8/2009 | Manasse |
| 7,593,342 B2 * | 9/2009 | Molisch ................ H04B 7/026 370/238 |
| 7,818,607 B2 | 8/2010 | Turner et al. |
| 7,924,906 B2 | 4/2011 | Rice |
| 7,958,426 B2 | 6/2011 | Betts |

(Continued)

OTHER PUBLICATIONS

Notice of Allowance dated May 8, 2015 for U.S. Appl. No. 13/853,881, filed Mar. 29, 2013 in the name of Hongi Yao.

(Continued)

*Primary Examiner* — Esaw Abraham
(74) *Attorney, Agent, or Firm* — Steinfl + Bruno LLP

(57) ABSTRACT

A computer-based distributed error correction scheme with an efficient decoding algorithm is disclosed. The efficiency of the corresponding decoding algorithm, based on standard single source Reed-Solomon error correcting codes, makes the practical employment of the DECC feasible. Various implementation examples are also provided.

5 Claims, 7 Drawing Sheets

(56) References Cited

U.S. PATENT DOCUMENTS

| | | |
|---|---|---|
| 8,069,388 B2 | 11/2011 | Betts |
| 8,139,512 B2 * | 3/2012 | Charbit ............. H04B 7/15592 370/279 |
| 8,301,078 B2 * | 10/2012 | Kim .................. H04B 7/15592 370/211 |
| 8,311,096 B2 | 11/2012 | Rusch-Ihwe |
| 8,381,024 B2 | 2/2013 | Turner et al. |
| 8,385,324 B2 * | 2/2013 | Achir .................... H04L 25/14 370/310 |
| 8,402,334 B2 * | 3/2013 | Yu ........................ H04L 1/1812 714/749 |
| 8,416,730 B2 * | 4/2013 | Vucetic ............. H04B 7/15557 370/315 |
| 8,522,122 B2 | 8/2013 | Alves et al. |
| 8,532,143 B2 * | 9/2013 | Achir ................ H03M 13/1105 370/252 |
| 8,601,350 B2 * | 12/2013 | Achir ................ H04B 7/15521 714/776 |
| 8,611,271 B2 * | 12/2013 | Erkip ................ H04B 7/15592 370/310 |
| 8,787,428 B2 * | 7/2014 | Dai ................... H04B 7/15592 370/315 |
| 9,015,242 B2 * | 4/2015 | Dorso ................ H04L 65/1069 709/201 |
| 9,119,174 B2 * | 8/2015 | Lee ...................... H04L 1/1858 |
| 9,130,742 B2 | 9/2015 | Yao et al. |
| 9,148,173 B2 | 9/2015 | Yao et al. |
| 9,369,275 B2 | 6/2016 | Yao et al. |
| 9,577,734 B2 * | 2/2017 | Le Bars ................ H04B 7/022 |
| 2003/0076959 A1 | 4/2003 | Chui |
| 2005/0140964 A1 | 6/2005 | Eschenauer et al. |
| 2006/0136713 A1 | 6/2006 | Zimmer et al. |
| 2007/0277035 A1 | 11/2007 | Patel et al. |
| 2009/0046854 A1 | 2/2009 | Di Crescenzo |
| 2011/0010538 A1 | 1/2011 | Falk et al. |
| 2012/0300939 A1 | 11/2012 | Du et al. |

OTHER PUBLICATIONS

Notice of Allowance for U.S. Appl. No. 13/853,881, filed Mar. 29, 2013 on behalf of Hongyi Yao, dated Mar. 26, 2015. 23 pages.
Notice of Allowance for U.S. Appl. No. 13/853,881, filed Mar. 29, 2013 on behalf of Hongyi Yao, dated May 8, 2015. 19 pages.
Notice of Allowance for U.S. Appl. No. 14/696,304, filed Apr. 24, 2015 on behalf of Hongyi Yao, dated Feb. 11, 2016. 15 pages.
Notice of Allowance for U.S. Appl. No. 15/150,322, filed May 9, 2016 on behalf of Hongyi Yao, dated Sep. 30, 2016. 13 pages.
Non-Final Office Action for U.S. Appl. No. 13/853,857, filed Mar. 29, 2013 on behalf of Hongyi Yao, dated Feb. 20, 2015. 11 pages.
Notice of Allowance for U.S. Appl. No. 13/853,857, filed Mar. 29, 2013 on behalf of Hongyi Yao, dated Jun. 12, 2015. 6 pages.
Di Pietro, R. et al., "Random Key-Assignment for Secure Wireless Sensor Networks.", SASN '03, pp. 1-9, Oct. (2003).
Non-Final Office Action for U.S. Appl. No. 15/362,758, filed Nov. 28, 2016 on behalf of Hongyi Yao, dated Apr. 19, 2017. 8 pages.

\* cited by examiner

DISTRIBUTED REED-SOLOMON CODES FOR SIMPLE MULTIPLE ACCESS NETWORKS

CROSS REFERENCE TO RELATED APPLICATIONS

The present application is a Continuation of U.S. patent application Ser. No. 13/853,857 filed Mar. 29, 2013, which in turn claims priority to U.S. provisional Patent Application Ser. No. 61/618,284, filed on Mar. 30, 2012, for an "Efficient Construction of Distributed Error", which are all herein incorporated by reference in their entirety.

STATEMENT OF GOVERNMENT GRANT

This invention was made with government support under FA9550-10-1-0166 awarded by the Air Force and under CNS0905615 awarded by the National Science Foundation. The government has certain rights in the invention.

BACKGROUND

Technical Field

The present disclosure relates to methods and algorithms related to the field of distributed error correction codes (DECC) which is covered in various areas such as information theory, coding theory and communication theory, with applications in computer science and telecommunication. In particular, the present disclosure presents a novel construction for DECC, which has an efficient decoding algorithm and therefore is feasible for practical deployment of DECC.

Description of the Prior Art

A purely random code construction for DECC is able to achieve a maximum communication throughput with high probability. However, the decoding complexity at the receiver is exponentially high, which is not acceptable in practical scenarios. The present disclosure addresses this problem by providing an efficient and practical implementation of DECC.

SUMMARY

Throughout the present disclosure reference will be made to the enclosed Annex A1, which makes part of the present disclosure.

According to a first aspect of the present disclosure, a computer-based network with distributed error correction code (DECC) is presented, the computer-based network being configured to encode a plurality of source files on a distributed network of a plurality of computer-based workstations, and decode the plurality of files on a single computer-based workstation using a DECC decoding algorithm corresponding to a standard single-source Reed-Solomon error correcting code decoder.

According to a second aspect of the present disclosure, a computer-based method for distributing a plurality of source files over a simple multiple access network (SMAN), the SMAN comprising a plurality of computer-based relay nodes configured to transmit a plurality of encoded files to a computer-based receiver node is presented, the method comprising: redundantly providing through a plurality of computer-based source transmission links, a plurality of source files to the plurality of computer-based relay nodes; providing to each computer-based relay node, a software and/or hardware based encoder according to a distributed error correction code (DECC) algorithm; encoding through the provided encoder, the redundantly provided plurality of source files within each computer-based relay node; based on the encoding, transmitting via a plurality of computer-based relay transmission links, a plurality of encoded files to the computer-based receiver node; based on the transmitting, receiving the plurality of encoded files; based on the receiving, decoding the plurality of encoded files using a software and/or hardware based decoder based on a DECC algorithm, the DECC algorithm being a single-source Reed-Solomon decoding algorithm; based on the decoding, obtaining the plurality of source files.

Further aspects of the disclosure are shown in the specification, drawings and claims of the present application.

DETAILED DESCRIPTION

Figure 1:
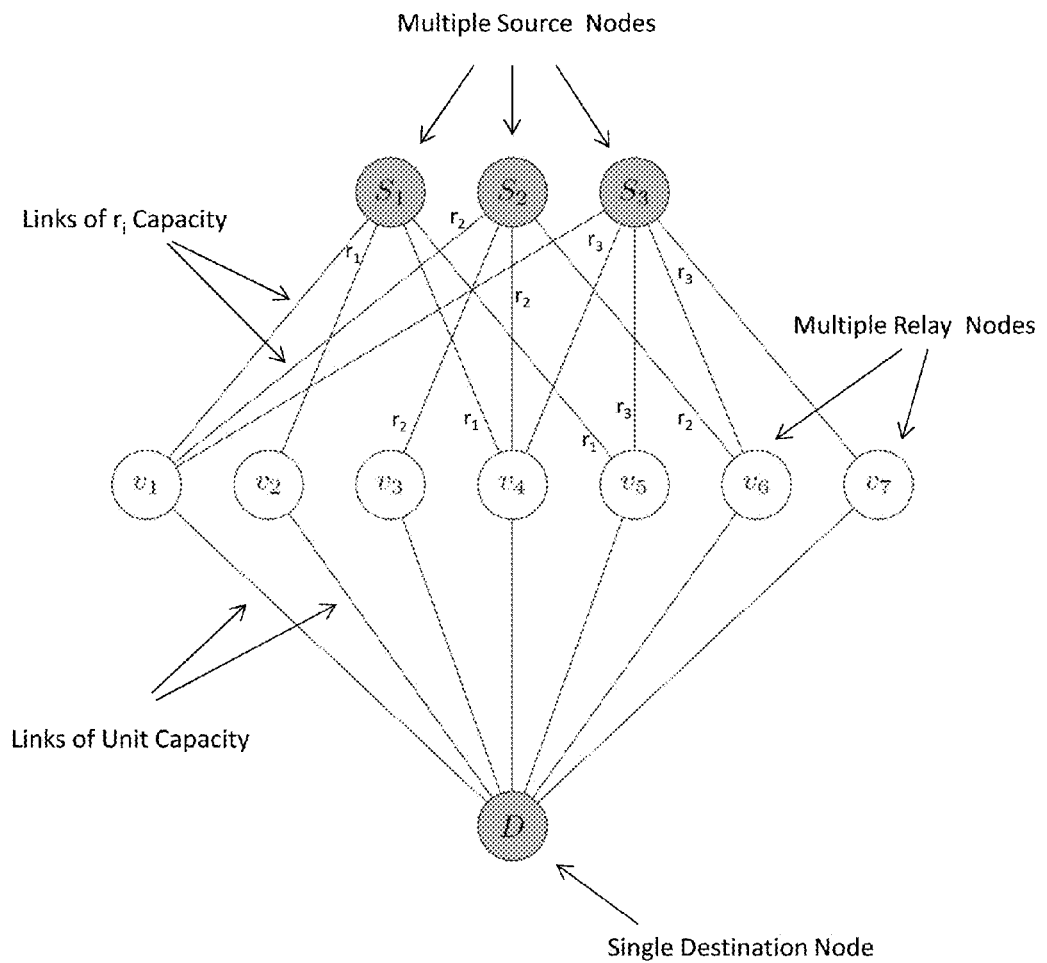
FIG. 1 shows a diagram of a simple multiple access network (SMAN), comprising source nodes, relay nodes and one destination node, joint via transmission links of various capacities.

Throughout the present disclosure, including the Annex A1, the term simple multiple access network (SMAN) refers to the network topology of FIG. 1, where multiple source nodes ($S_1$, $S_2$, $S_3$), multiple relays nodes ($v_1$, $v_2$, ..., $v_7$) and one destination node D communicate via links of various capacities and as dictated by the associated full capacity region. More information on the full capacity region and how it is established is provided in reference [2] of Annex A1.

In the present disclosure, a novel construction for distributed error correction codes (DECC), which has an efficient decoding algorithm and therefore is feasible for practical employment of DECC is presented.

In the scenario of distributed error correction coding and in reference to FIG. 1, the source information provided within multiple source nodes ($S_1$, $S_2$, $S_3$) is transmitted via transmission source links of capacity at least ($r_1$, $r_2$, $r_3$) (e.g. information rate), respectively associated to each of the sources ($S_1$, $S_2$, $S_3$), to multiple relay nodes ($v_1$, $v_2$, ..., $v_7$) where the source information is stored redundantly across the multiple nodes ($v_1$, $v_2$, ..., $v_7$) and in a manner known for example by the receiver node D. As a consequence, each of the nodes ($v_1$, $v_2$, ..., $v_7$) stores a subset of the source information ($S_1$, $S_2$, $S_3$). The receiver D wants to recover the source information from the nodes ($v_1$, $v_2$, ..., $v_7$) via links of unit capacity (e.g. normalized values). However, an unknown subset of the nodes, their stored information, or the channels between the nodes and the receiver (e.g. transmission links) can be erroneous. The skilled person will realize that in some embodiments the source information ($S_1$, $S_2$, $S_3$) may be obtained by subdividing a single source message (e.g. a file) to multiple submessages $S_i$ without limiting the scope of the presented embodiment.

The objective of distributed error correction code is that the receiver can correctly recover the source information in the presence of such errors. DECC has potential applications such as distributed storage in cloud computing, network file distribution (e.g., P2P system), and wireless key pool bootstrapping. In some embodiment, each node may be a computer workstation adapted to perform various tasks, including sending/receiving data as well as performing various steps associated with the DECC (e.g. signal processing, encoding/decoding), and the link in-between nodes may be wired or wireless network transmission links.

A purely random code construction for DECC is able to achieve the maximum communication throughput with high probability. However, the decoding complexity at the receiver is exponentially high, which is not acceptable in practical scenarios.

Figure 2:
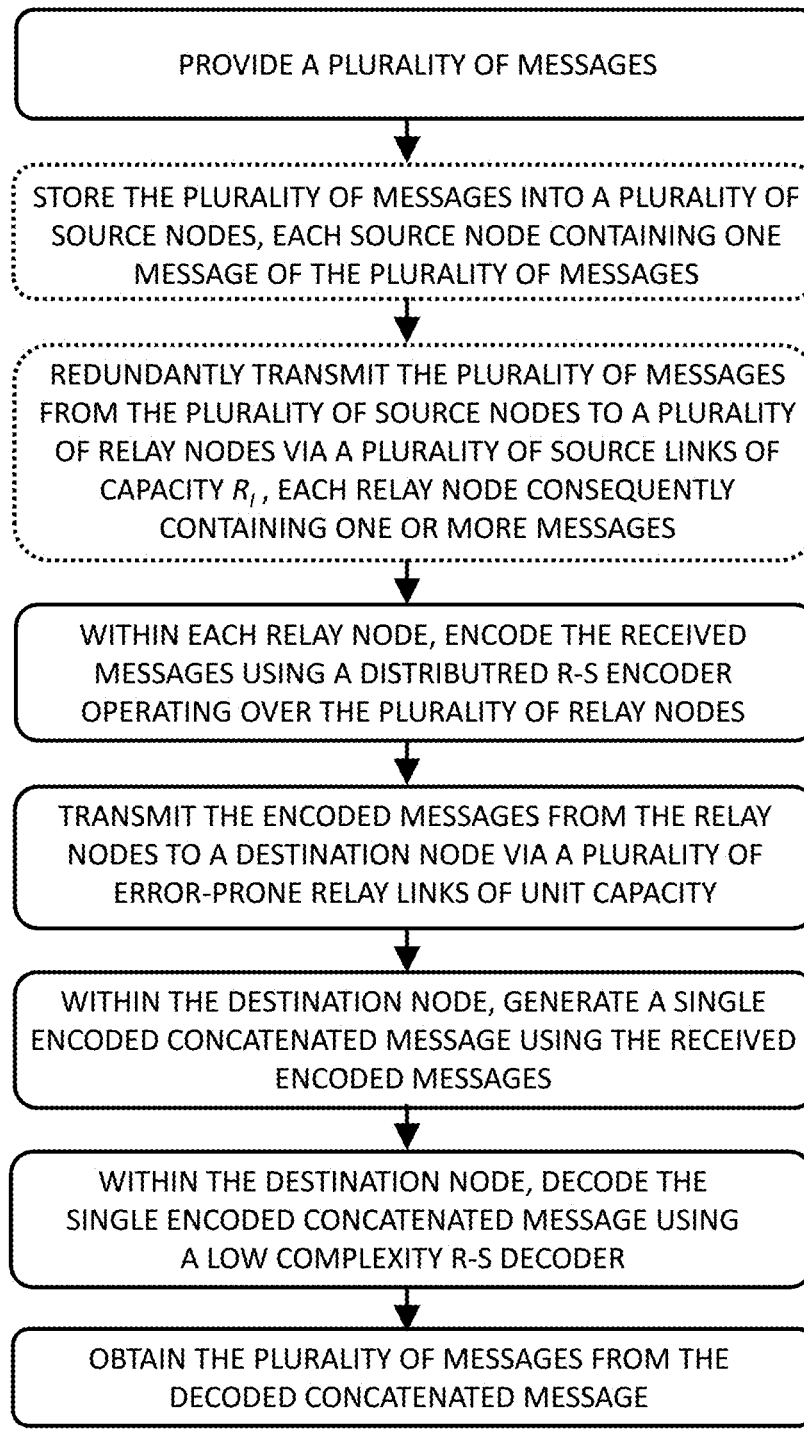
FIG. 2 shows an exemplary flowchart according to the present disclosure of a DECC for the SMAN of FIG. 1.
Figure 3:
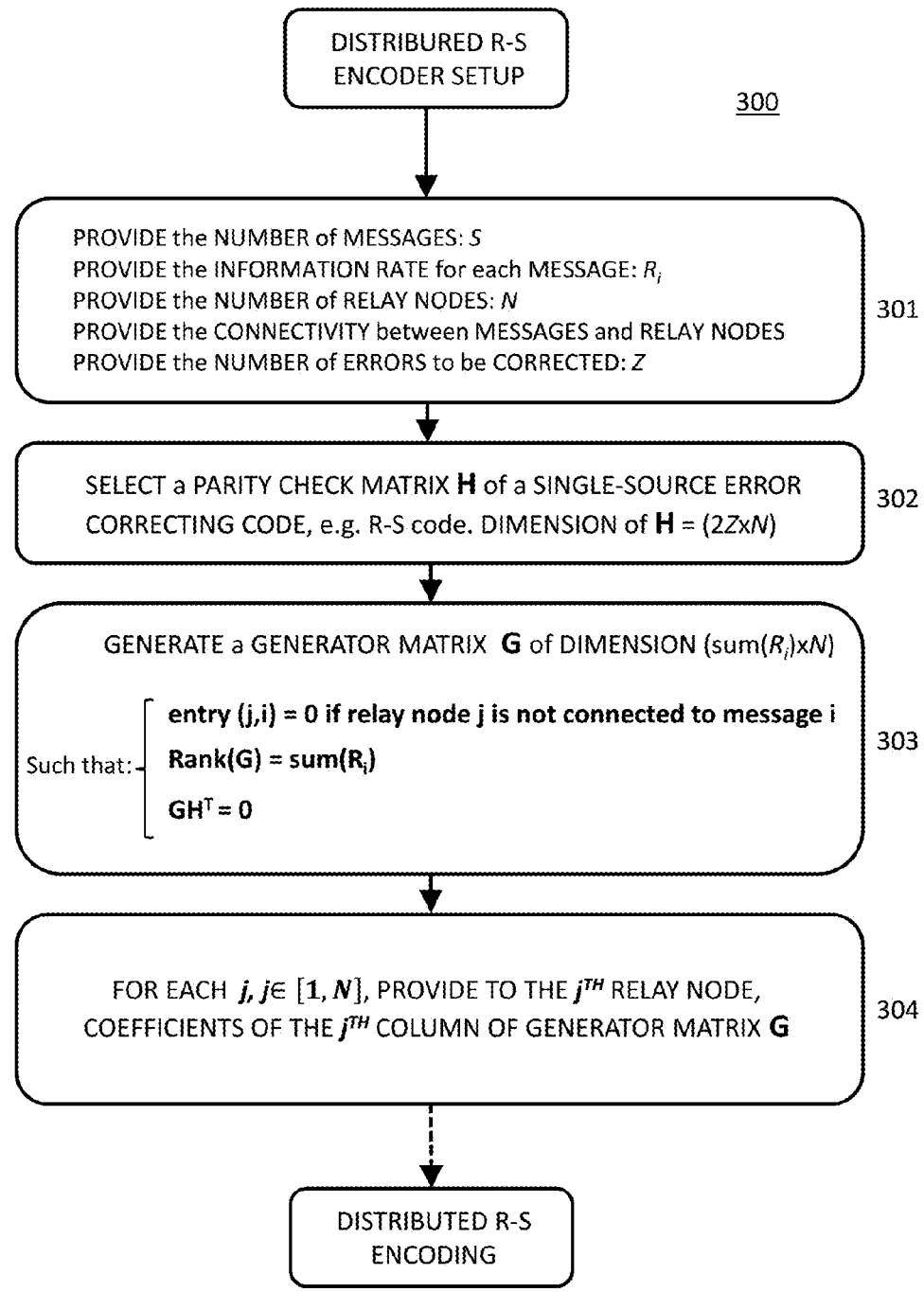
FIG. 3 shows an exemplary flowchart according to the present disclosure of the construction of the encoder for the presented DECC.

According to an embodiment of the present disclosure, an efficient linear DECC construction, which is described in further details in Annex A1, is presented. FIG. 2 shows an exemplary flow chart of a DECC for the SMAN of FIG. 1. It should be noted that the dashed boxes represent steps within the process which are not strictly necessary and provided simply for reasons of clarity. The DECC is further decomposed in a Setup phase, an Encoding phase and a Decoding phase, represented by flowcharts in FIGS. 2-4 respectively, and as per the following:

During the Setup phase of the DECC for a given SMAN communication network and in reference to the flowchart (300) of FIG. 3, perform the following steps:

First, (step 301 of flowchart 300) obtain the topology and characteristic of the communication network. Assume there are n relay nodes and there are at most z erroneous nodes or channels, Then (step 302) accordingly choose a parity check matrix H of a single-source error correcting code with low encoding and decoding complexity. One such matrix is the Vandermonde parity check matrix for RS codes. Then the dimension of the parity check matrix H is (2z×n).

Then (step 303) compute the linear subspace D, represented by a generator matrix G, whose row space is orthogonal to the rows of the parity check matrix H. The generator matrix G is selected such as for each relay node, say $V_s$, a corresponding column vector $G_s$ at the position s of the matrix G has all zero coefficients at positions corresponding to the messages that $V_s$ does not have (e.g. $V_7$ of FIG. 1 only receives message $S_3$, thus does not have messages $S_1$ and $S_2$). Subject to the positions of these zero coefficients and orthogonality with H, each row of G can be chosen independently and uniformly at random from all possible candidates, or can be chosen greedily (e.g. an arbitrary candidate for each row is chosen, subject to the condition that it is linearly independent from previously chosen rows).

Then (step 304) provide to each relay node $V_s$ the vector $G_s$ to be used for the encoding.

Figure 4:
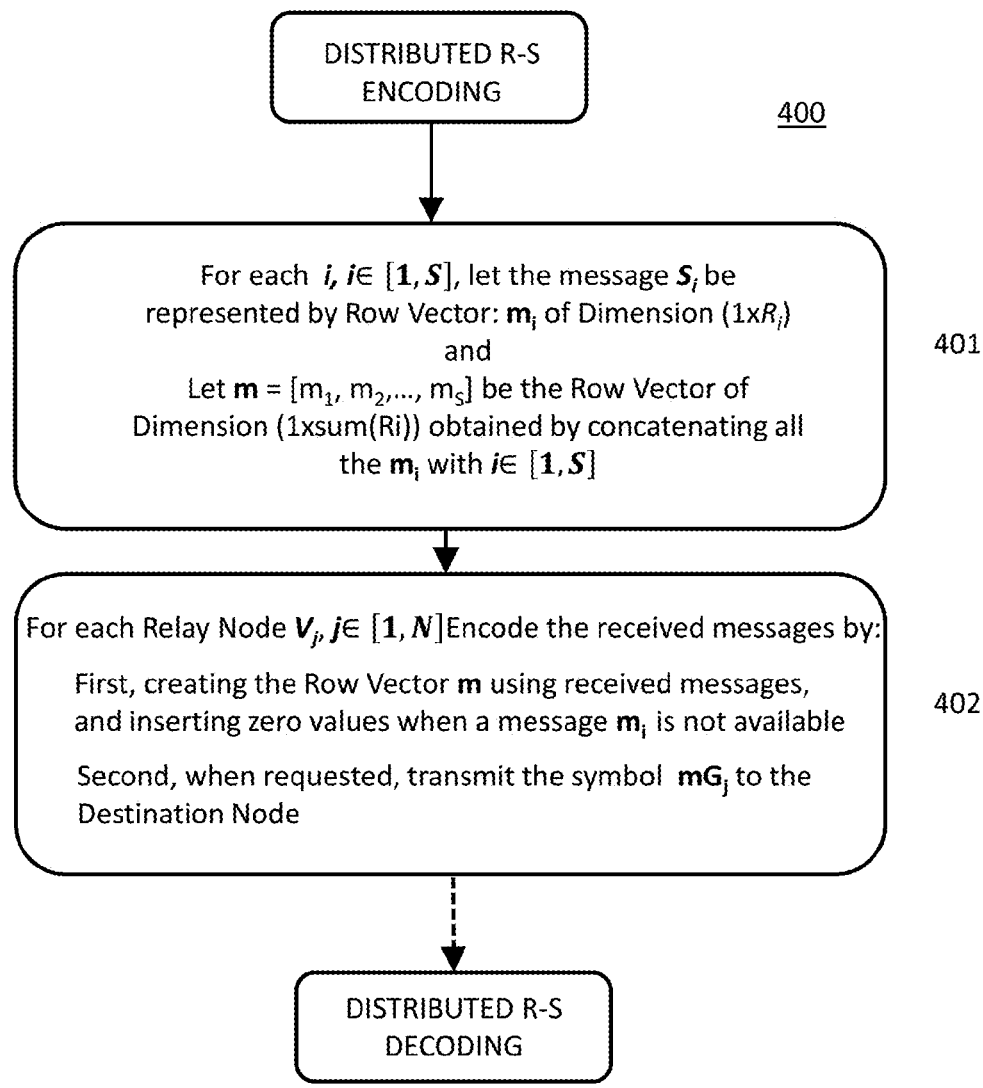
FIG. 4 shows an exemplary flowchart according to the present disclosure of the encoding steps for the presented DECC.

During the Encoding phase of the DECC for a given SMAN communication network and in reference to the flowchart (400) of FIG. 4, perform the following steps:

Upon receiving of the messages (steps 401 and 402 of flowchart 400), each relay node $V_s$ uses the provided vector $G_s$ to encode its received messages. During this process, the non-zero coefficients in $G_s$ are used as encoding coefficients to encode the messages for transmission to the receiver node. The relay node may concatenate the received messages to form a single vector upon which the encoding is performed, by inserting zeros as placeholders for the messages it does not have (e.g. are not sent to the particular relay node as per topology of the associated SMAN, see FIG. 1).

Figure 5:
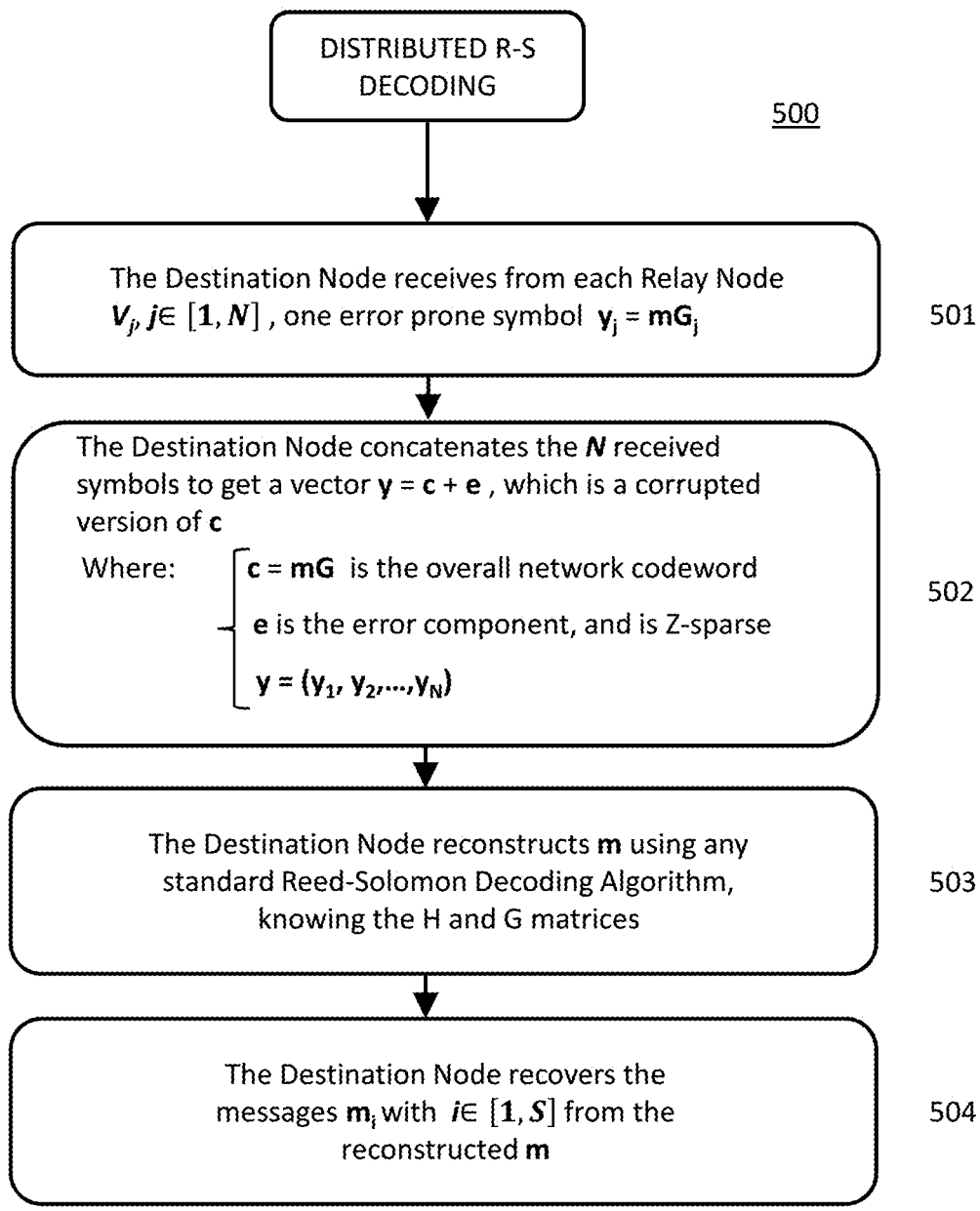
FIG. 5 shows an exemplary flowchart according to the present disclosure of the decoding steps for the presented DECC.

During the Decoding phase of the DECC for a given SMAN communication network and in reference to the flowchart (500) of FIG. 5, perform the following steps:

After receiving all the n messages from the relay nodes (step 501), the receiver organizes them as a vector (step 502).

The receiver then uses the received vector as an input to a standard error decoding algorithm (step 503) corresponding to the original single-source error correcting code to correct the errors in the received vector.

The receiver can then extract the individual source messages (step 504).

Numerical simulations executed so far show such construction is able to achieve the maximum error correction capacity in distributed error correction scenarios.

The person skilled in the art of information theory and coding theory will know how to apply the mentioned techniques and computations presented above and in Annex A1, including generation of the various matrices and encoding/decoding based on Reed Solomon codes and/or other cyclic error correcting codes, to the disclosed methods above. The skilled person may also find different sequences of applying the above steps represented in flowcharts (200-500), whether serially, in parallel and/or combination thereof, to obtain a similar result, and implement those using various hardware, software, firmware and/or combination thereof.

Figure 6:
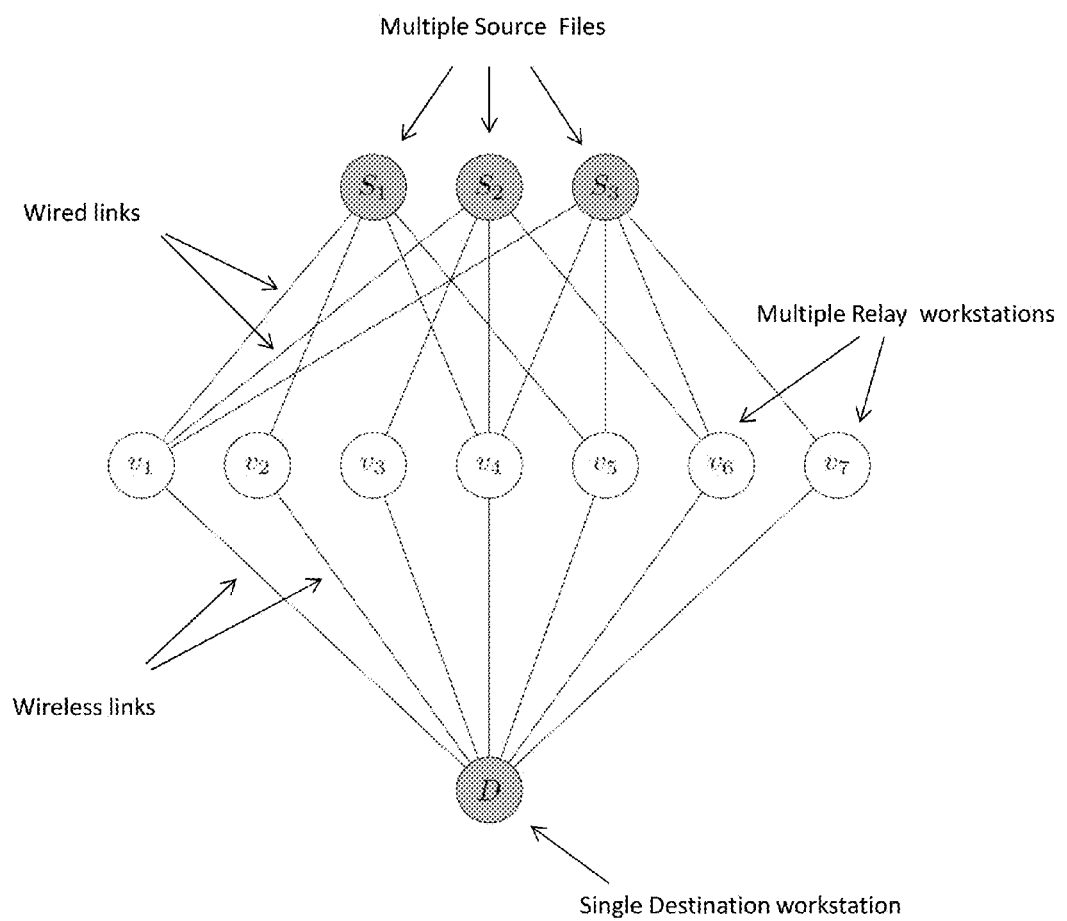
FIG. 6 shows a communication system for file distribution based on the SMAN of FIG. 1.

With reference to FIG. 6, a communication system for file distribution and based on the SMAN of FIG. 1 is presented. Each file, represented by $S_i$ may be a data file, an audio file, a video file or any other file containing information which one may want to transmit using an error prone link and receive devoid of errors. Each file $S_i$ may be stored on any storage medium known to the skilled person (e.g. hard disk, optical disc, magneto-optical disc, tape, cloud, RAID, RAM, ROM, etc.) using any file system known to the skilled person (DOS, FAT, NTFS, HFS, UDF, ISO 9660, etc . . . ) or even a proprietary file format. These storage mediums are connected, via some connection scheme (e.g. a wired link, a wireless link) which we here assume as being wired, thus including a cable with some number of conductor wires, to the multiple relay workstations $V_i$ which in the communication network of FIG. 6 are equivalent in functionality to the relay nodes represented in the SMAN of FIG. 1. Such scheme may also include any connection using copper wires or fiber optic, such as USB, Ethernet, RS-232, ATAPI, SATA, SPDIF, HDMI, proprietary, etc. . . .

If the size of the file $S_i$ is $R_i$ then the link capacity (e.g. information rate) between each storage and a corresponding relay workstation is at least the file size $R_i$. Also, each relay workstation of FIG. 6 may be a computer processor with the appropriate interface to the storage medium containing the files. This processor may be implemented using any target hardware (e.g. FIG. 7, described later) with reasonable computing power and memory size, either off the shelf, such as a mainframe, a microcomputer, a desktop (PC, MAC, etc.), a laptop, a notebook, etc. or a proprietary hardware designed for the specific task and which may include a microprocessor, a digital signal processor (DSP), various FPGA/CPLD, etc.

For any given hardware implementation of a relay workstation $V_i$, corresponding software/firmware may be used to generate all or portion of the encoding steps required by the DECC as some of the associated steps (e.g. flowcharts 200-500 and Annex A1), such as one that are computational intensive, may be implemented using the target hardware itself or a dedicated hardware residing on an I/O port of the workstation. Each workstation $V_i$ may not have access to all source files and therefore and as depicted by FIG. 6 may only operate on a subset of the available files. Furthermore, each file may be of any size, and thus for reason of practicality, it can be broken up in smaller sub-files, each to be independently encoded as per the provided DECC scheme (e.g. flowcharts 200-500, and Annex A1).

Once the relay workstations $V_i$ have accessed the information files, whether read into a local memory first or while reading segments of the information files, can encode the files as per the provided DECC encoding scheme and as described in prior paragraphs. The encoding can be implemented in a combination of hardware, firmware and software, working in unison to generate the encoded file. In one configuration, files can be buffered onto a local memory of a relay workstation and then progressively fed to a dedicated hardware printed circuit board (PCB) residing into the workstation at an I/O location (e.g. item 40 of FIG. 7) and interfacing with the workstation's central processor (e.g. item 15 of FIG. 7) via some dedicated interface bus (e.g. item 35 of FIG. 7). The files may be formatted as per the DECC requirement (e.g. first step of step 402 of flowchart 400) prior to being fed to the dedicated PCB. The PCB in turn may execute the main computational intensive task of encoding (e.g. second step of step 402 of flowchart 400) and buffer the encoded data in a different area of memory accessible by the workstation's central processor. Finally, when requested by the destination workstation (D), the relay workstation may transmit the encoded data via the available link to the destination workstation (D). The task of governing the overall operation of any of the workstations may be assigned to a software (executable) program (e.g. item 30 of FIG. 7) stored in a segment of memory (e.g. item 20 of FIG. 7) of each workstation. When the program is loaded and running in the workstation, it can initiate the task of reading the various input files, formatting the files and send to the dedicated PCB, reading the encoded files and sending these to the destination workstation (D). Initiation of these tasks may be performed automatically or as a response to some initializing commands received by the program.

In the exemplary embodiment of FIG. 6, the links between each workstation $V_i$ and the destination workstation (D) may be wireless (e.g. using electromagnetic waves, such as WiFi, Bluetooth, proprietary, etc. . . . ) and the workstation (D) may physically reside in a different location from the relay workstations. It should also be noted that the relay workstations may also reside in different locations with respect to each other, in which case a suitable interface to the source files may be selected (e.g. files are on cloud).

Figure 7:
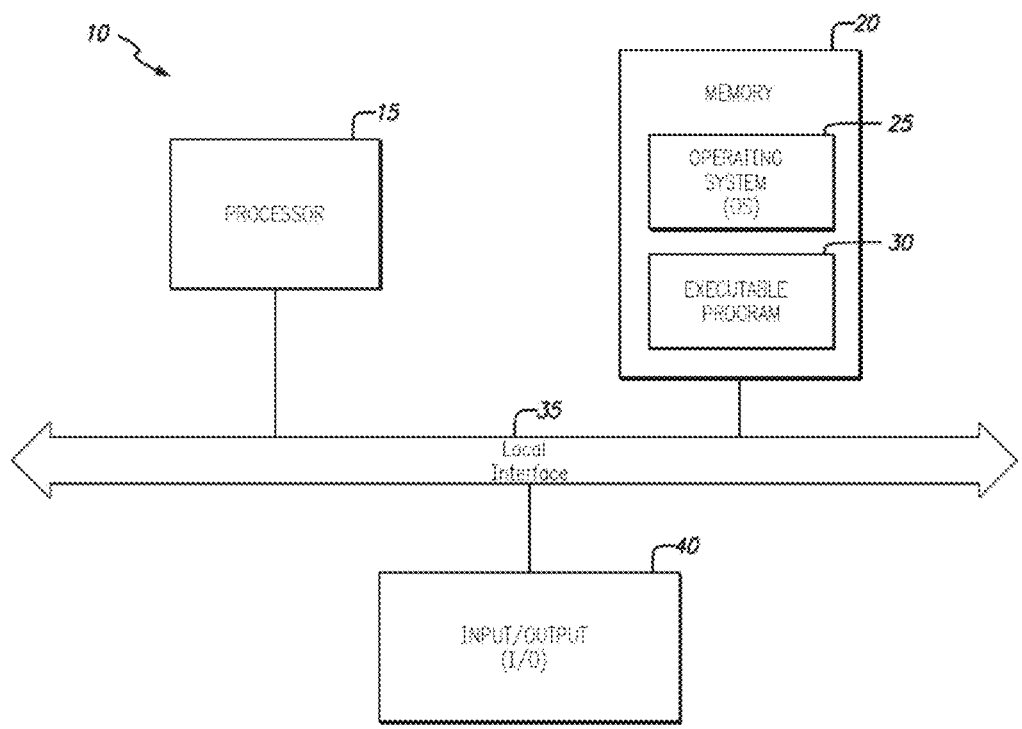
FIG. 7 shows an exemplary embodiment of a target hardware for implementation of a node of the presented SMAN.

The destination workstation of FIG. 6 may also be a computer processor, such as one depicted in FIG. 7, with the appropriate interface to communicate with the relay workstations, and appropriate amount of memory and processor speed to perform the task of DECC decoding in a practical amount of time. Again and as it was the case for the relay workstations $V_i$, the various steps involved in the DECC decoding (e.g. flow chart 500 and Annex A1) may be partitioned amongst various available resources within the destination workstation (D). Here again, a dedicated PCB containing a combination of hardware and firmware may be used to perform the computational intensive tasks of decoding (e.g. steps 502 and 503 of flowchart 500), whereas a main program may be used to control the overall operation, as well as data communication and formatting (e.g. steps 501 and 504 of flowchart 500). Once all the data files have been decoded, the resultant (error free) decoded files may be stored on a storage device local to or remote from the destination workstation (D). The skilled person may need no further explanation on operation of the DECC implementation of FIG. 6. It should be noted, that given powerful enough workstations, wherein very fast processors (e.g. item 15 of FIG. 7) with large amount of memory (e.g. item 20 of FIG. 7) communicating over wide data buses (e.g. item 35 of FIG. 7) and performing parallel tasks are provided, the entirety of the computational intensive tasks (e.g. items 402, 502 and 503 of flowcharts 400, 500) may be performed via software running in the workstation's memory and using available workstation resources, without the need of the dedicated hardware PCBs presented above.

FIG. 7 is an exemplary embodiment of a target hardware (10) (e.g. a computer system) for implementing the DECC embodiment of FIG. 6 and as discussed in the previous paragraphs. This target hardware, represented by the workstations of FIG. 6, comprises a processor (15), a memory bank (20), a local interface bus (35) and one or more Input/Output devices (40). The processor may execute one or more instructions related to the implementation of FIG. 6 (e.g. flow charts 200-500 and Annex A1) and as provided by the Operating System (25) based on some executable program stored in the memory (20). These instructions are carried to the processors (20) via the local interface (35) and as dictated by some data interface protocol specific to the local interface and the processor (15). It should be noted that the local interface (35) is a symbolic representation of several elements such as controllers, buffers (caches), drivers, repeaters and receivers that are generally directed at providing address, control, and/or data connections between multiple elements of a processor based system. In some embodiments the processor (15) may be fitted with some local memory (cache) where it can store some of the instructions to be performed for some added execution speed. Execution of the instructions by the processor may require usage of some input/output device (40), such as inputting data from a file stored on a hard disk, inputting commands from a keyboard, outputting data to a display, or outputting data to a USB flash drive. In some embodiments, the operating system (25) facilitates these tasks by being the central element to gathering the various data and instructions required for the execution of the program and provide these to the microprocessor. In some embodiments the operating system may not exist, and all the tasks are under direct control of the processor (15), although the basic architecture of the target hardware device (10) will remain the same as depicted in FIG. 7. In some embodiments a plurality of processors may be used in a parallel configuration for added execution speed. In such a case, the executable program may be specifically tailored to a parallel execution. Also, in some embodiments the processor (15) may execute part of the implementation of FIG. 6, and some other part may be implemented using dedicated hardware/firmware placed at an Input/Output location accessible by the target hardware (10) via local interface (35) (e.g. dedicated PCB boards). The target hardware (10) may include a plurality of executable program (30), wherein each may run independently or in combination with one another.

The examples set forth above are provided to give those of ordinary skill in the art a complete disclosure and description of how to make and use the embodiments of the distributed Reed-Solomon codes for simple multiple access networks of the present disclosure, and are not intended to limit the scope of what the inventors regard as their disclosure.

Such embodiments may be, for example, used within computer science and communication fields with applications in distributed storage in cloud computing, network file distribution and wireless key pool bootstrapping where error free reconstruction of a set of original files is the goal. The skilled person may find other suitable implementations of the presented embodiments.

Modifications of the above-described modes for carrying out the disclosure, including pressure control devices, accumulators, and so forth, may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

Distributed Reed-Solomon Codes for Simple Multiple Access Networks

Wael Halbawi and Tracey Ho

California Institute of Technology

Pasadena, California 91125, USA

Email: whalbawi@caltech.edu, tho@caltech.edu

Hongyi Yao

Oracle Corporation

400 Oracle Parkway

Redwood City, California 94065, USA

Email: yaohongyi03@gmail.com

Abstract

We consider a simple multiple access network in which a destination node receives information from multiple sources via a set of relay nodes. Each relay node has access to a subset of the sources, and is con-

ANNEX A1 nected to the destination by a unit capacity link. We propose a computationally efficient distributed coding scheme and show that it achieves the full capacity region for up to three sources. Specifically, the relay nodes encode in a distributed fashion such that the overall codewords received at the destination are codewords from a single Reed Solomon code.

1 Introduction

We consider a simple multiple access network in which a single destination node wishes to receive information from multiple sources via a set of relay nodes, each of which has access to a subset of the sources. Each relay node is connected to the destination by a unit capacity link. Our objective to design a distributed code that can correct arbitrary adversarial errors on up to $z$ links (or, equivalently, relay nodes). This problem has been considered previously by (Yao, Ho, & Nita-Rotaru, 2011) in the context of decentralized distribution of keys from a pool, where it was shown to be a special case of the general multiple access network error correction problem, whose capacity region was established in (Dikaliotis et al., 2011). It can also apply to other distributed data storage/retrieval scenarios where different nodes store different subsets of the source messages.

In this paper, we propose a computationally efficient coding scheme, distributed Reed Solomon codes, for the simple multiple access network. In

ANNEX A1 particular, the relay nodes encode in a distributed fashion such that the overall codewords received at the destination are codewords from a single Reed Solomon code, which allows the destination to decode efficiently using classical single-source Reed Solomon decoding algorithms. This scheme obviates the need for encoding over successively larger nested finite fields at each source as in the prior construction of (Dikaliotis et al., 2011).

2 System model and background

A Simple Multiple Access Network (SMAN) is defined as follows. A single destination node $D$ wishes to receive information from multiple source nodes $\mathcal{S} = \{S_1, S_2, \ldots, S_s\}$ via a set of intermediate relay nodes $\mathcal{V} = \{v_1, \ldots, v_n\}$. The information rate of each source $S_i \in \mathcal{S}$ is denoted by $r_i$. Each relay node has access to a subset of sources, or equivalently, each source $S_i \in \mathcal{S}$ is connected to a subset of relay nodes by *source* links of capacity $r_i$. Each relay node $v_i \in \mathcal{V}$ is connected to $D$ by a link of unit capacity. We refer to these links as *relay* links. We assume that an omniscient adversary can introduce arbitrary errors on up to $z$ relay links. An example of a SMAN is given in Fig. 1.

Each SMAN is associated with an adjacency matrix $\mathbf{T}$, where the rows and columns represent $\mathcal{S}$ and $\mathcal{V}$, respectively, and $\mathbf{T}_{i,j} = 1$ if there exists a source link connecting $S_i$ to $v_j$.

The coding scheme operates over a finite field $\mathbb{F}_q$, where $q$ is a power of a prime $p$ and $q \geq n+1$.

3 Distributed Reed-Solomon Codes

To construct a distributed Reed-Solomon code for the above-described SMAN with $n$ intermediate relay nodes and $z$ errors, we start with a $[n, k, d]_q$ Reed-Solomon code where $d = 2z + 1 = n - k + 1$. This is a $k$-dimensional subspace $\mathcal{C} \subseteq \mathbb{F}_q^n$ which is orthogonal to the row space of the parity check matrix $\mathbf{H} \in \mathbb{F}_q^{2z \times n}$ given by $$\mathbf{H} = \begin{bmatrix} 1 & \alpha & \alpha^2 & \cdots & \alpha^{n-1} \\ 1 & \alpha^2 & \alpha^4 & \cdots & \alpha^{2(n-1)} \\ \vdots & \vdots & \vdots & \ddots & \vdots \\ 1 & \alpha^{2z} & \alpha^{4z} & \cdots & \alpha^{2z(n-1)} \end{bmatrix} \quad (1)$$

where $\alpha \in \mathbb{F}_q$ is a primitive element.

In the context of a SMAN, the overall linear transformation from the sources to the destination can be represented by a generator matrix $\mathbf{G} \in \mathbb{F}_q^{r_x \times n}$. We can write $\mathbf{G}$ as $$\mathbf{G} = \begin{bmatrix} \mathbf{G}_1 \\ \mathbf{G}_2 \\ \vdots \\ \mathbf{G}_s \end{bmatrix} \quad (2)$$

ANNEX A1 where the $j$th column of each submatrix $\mathbf{G}_i \in \mathbb{F}_q^{r_i \times n}$ is all zero if $S_i$ is not connected to $v_j$. The nonzero entries can be freely chosen.

To construct a distributed Reed Solomon code for the SMAN, we choose the coding coefficients such that the rows of $\mathbf{G}$ span an $r_\mathcal{I}$-dimensional subspace of $\mathcal{C}$. Namely, the following two conditions have to be met:

$$r\mathcal{C}/\text{rank}(\mathbf{G}) = r_\mathcal{I} \qquad (3)$$

$$\mathbf{G}\mathbf{H}^t = 0 \qquad (4)$$

where $\text{rank}(\cdot)$ denotes the row rank. For each source $i$, we can straightforwardly find a basis for the vector space of possible rows of $\mathbf{G}_i$ (whose $j$th column is zero if $S_i$ is not connected to $v_j$) satisfying $\mathbf{G}_i \mathbf{H}^t = 0$.

Let the message of source $S_i$ be represented by a row vector $\mathbf{m}_i = \left[ m_1^{(i)}, \ldots, m_{r_i}^{(i)} \right]$, where $m_k^{(i)} \in \mathbb{F}_q$. The $j$th relay node encodes using the $j$th column $\mathbf{G}_j$ of the generator matrix $\mathbf{G}$, and transmits the symbol $[\mathbf{m}_1 \ \mathbf{m}_2 \ \ldots \ \mathbf{m}_s]\mathbf{G}_j$. Let $\mathbf{c}$ denote the overall network codeword $\mathbf{c} = [\mathbf{m}_1 \ \mathbf{m}_2 \ \ldots \ \mathbf{m}_s]\mathbf{G}$. The destination node $D$ receives a corrupted version of $\mathbf{c}$, denoted by $\mathbf{y} = \mathbf{c} + \mathbf{e}$, where $\mathbf{e}$ is $z$-sparse, and $y_i$ is the symbol received by $D$ through the $i^{th}$ relay link. To reconstruct $\mathbf{m}$, $D$ uses any standard Reed-Solomon decoding algorithm.

ANNEX A1

References

Dikaliotis, T., Ho, T., Jaggi, S., Vyetrenko, S., Yao, H., Effros, M., ... Erez, E. (2011). Multiple access network information-flow and correction codes. *Special issue of the IEEE Transactions on Information Theory dedicated to the scientific legacy of Ralf Koetter*, 57(2), 1067–1079.

Yao, H., Ho, T., & Nita-Rotaru, C. (2011). Key agreement for wireless networks in the presence of active adversaries. In *Proc. ieee asilomar conf. on signals, sys. and comp.*

The invention claimed is:

1. A single computer-based receiver node comprising a processor configured to:
   i) communicate over a computer-based network with distributed error correction code (DECC),
   ii) receive source files from multiple computer-based source nodes of the computer-based network via a plurality of computer-based relay nodes of the computer-based network, the source files being encoded by the computer-based relay nodes for transmission to the computer-based receiver, node into encoded source files, and
   iii) decode the encoded source files according to a single-source error correcting code having a parity check matrix and a generator matrix whose dimensions are selected based on a number of the plurality of computer-based relay nodes, decoding being operatively implemented in one of: a) hardware, b) software, and c) a combination of a) and b),
   wherein one or more of the plurality of encoded source files received by the computer-based receiver node are erroneous due to an erroneous relay transmission link and/or an erroneous computer-based relay node, and
   wherein the source files are encoded by the plurality of computer-based relay nodes based on the single source error correcting code.

2. The single computer-based receiver node of claim 1, wherein the single-source error correcting code is a single-source Reed-Solomon code.

3. The single computer-based receiver node of claim 1, wherein the processor is further configured to perform the following steps:
   1) after receiving the encoded source files from the computer-based relay nodes, organizes the encoded source files as a received single vector;
   2) uses the received single vector in combination with the parity check matrix and the generator matrix of the single-source error correcting code to find locations and values of errors in the received single vector; and
   3) knowing the errors from step 2), either subtracts the errors from the received encoded source files to decode corrected source files, or obtains a corrected vector, which is a concatenation of the corrected source files, and extracts the corrected source files therefrom.

4. The single computer-based receiver node of claim 3, wherein the single-source error correcting code is a single-source error correcting code with low encoding and decoding complexity used in the encoding of the encoded source files.

5. The single computer-based receiver node of claim 3, wherein the single-source error correcting code is a single-source Reed-Solomon code.

* * * * *